United States Patent [19]
Oikawa

[11] Patent Number: 6,074,102
[45] Date of Patent: Jun. 13, 2000

[54] OPTICAL DEVICE CAPABLE OF OPERATING AT HIGH SPEEDS

[75] Inventor: Yoichi Oikawa, Sapporo, Japan

[73] Assignee: Fujitsu Limited, Kawasaki, Japan

[21] Appl. No.: 09/102,352

[22] Filed: Jun. 23, 1998

[30] Foreign Application Priority Data

Feb. 12, 1998 [JP] Japan .................................. 10-029684

[51] Int. Cl.[7] .................................................. G02P 6/36
[52] U.S. Cl. ............................................................ 385/88
[58] Field of Search ........................ 385/88–92, 141–143, 385/147, 131, 83, 93, 49; 250/216, 551, 214 LS; 257/432, 82, 98, 80, 664; 359/154, 173

[56] References Cited

U.S. PATENT DOCUMENTS

| | | | |
|---|---|---|---|
| 4,989,930 | 2/1991 | Nakagawa et al. | 385/35 |
| 5,221,984 | 6/1993 | Furuyama et al. | 359/154 |
| 5,434,426 | 7/1995 | Furuyama et al. | 250/551 |
| 5,621,837 | 4/1997 | Yamada et al. | 385/88 |
| 5,644,667 | 7/1997 | Tabuchi et al. | 385/49 |
| 5,764,832 | 6/1998 | Tabuchi et al. | 385/49 |

FOREIGN PATENT DOCUMENTS 63-250181 10/1988 Japan .
3-290977 12/1991 Japan .
5-281024 10/1993 Japan .
9-139253 5/1997 Japan .

*Primary Examiner*—Akm E. Ullah
*Attorney, Agent, or Firm*—Staas & Halsey LLP

[57] ABSTRACT

The present invention relates to an optical device capable of operating at high speeds. This optical device includes an optical fiber, an optical semiconductor element, a base member, a signal terminal, and a pair of ground pins. The optical fiber is optically connected to the optical semiconductor element. The base member is formed of a conductor and has a first surface and a second surface. The optical semiconductor element is mounted on the first surface. The first surface and the second surface are substantially parallel to each other, for example. The signal terminal is electrically connected to the optical semiconductor element. The signal terminal is inserted through a hole extending from the first surface to the second surface of the base member and fixed in the hole filled with a glass paste so that a predetermined characteristic impedance is obtained between the signal terminal and the base member. The pair of ground pins are fixed to the second surface of the base member on the opposite sides of the signal terminal. With this configuration, characteristic impedance matching can be facilitated, and grounding can be enhanced, thereby allowing high-speed operation of the optical device.

12 Claims, 9 Drawing Sheets

OPTICAL DEVICE CAPABLE OF OPERATING AT HIGH SPEEDS

BACKGROUND OF THE INVENTION

1. Field of the Invention

The present invention relates generally to an optical device capable of operating at high speeds, and more particularly to an optical device having a package structure fit for characteristic impedance matching and grounding enhancement in an optical receiver.

2. Description of the Related Art

In a trunk optical communication system, a 10 Gb/s system has been put to practical use and its introduction has been started at present. As seen in explosive spread of Internet or the like, it is considered that the demand for the 10 Gb/s system will be rapidly increased in the future, and in an optical transmitter and an optical receiver for the 10 Gb/s system it is strongly desired to attain further cost reduction, mass production, and size reduction.

On the other hand, also in an optical wavelength division multiplexing system as a next-term system, the 10 Gb/s system is considered to become a base system. Therefore, the cost reduction, mass production, and size reduction of an optical transmitter and an optical receiver for the 10 Gb/s system will become an important issue also in constructing the next-term system. This issue cannot be attained by a conventional package structure, and it is therefore desired to provide an optical device having a novel package structure.

Referring to FIGS. 1A and 1B, there are shown a perspective view and a sectional view of a conventional O/E module (optical receiver), respectively. As shown in FIG. 1A, this O/E module includes a package 4 into which an optical fiber 2 is introduced, and a ceramic terminal 6 for outputting a high-speed electrical signal obtained by converting an optical signal transmitted by the optical fiber 2. A plurality of leads 8 for d.c. power or low-speed signal are provided on the opposite side surfaces of the package 4. This conventional structure is called also as a butterfly package from its appearance. As shown in FIG. 1B, a carrier 10 is fixed inside the package 4, and a photodetector 12 and an IC chip 14 for preamplification are provided on one side surface and the upper surface of the carrier 10, respectively. The ceramic terminal 6 is composed of a conductor layer 16 and a ceramic block 18 holding the conductor 16.

An optical signal output from the optical fiber 2 is converged by a lens 20 and next converted into an electrical signal by the photodetector 12. The electrical signal output from the photodetector 12 is amplified by the IC chip 14 and next output from this O/E module through the ceramic terminal 6.

In the above-mentioned prior art, the use of the ceramic terminal 6 excellent in high-speed operability can provide an optical device capable of operating at high speeds. However, since the package 4 and the carrier 10 are separate members, and the ceramic terminal 6 used is expensive, it is difficult to reduce cost.

In a relatively low-speed optical receiver in the prior art, a so-called coaxial package structure capable of attaining cost reduction is adopted in some case. However, such a conventional low-cost package structure has a problem such that it is difficult to ensure high-speed operability.

SUMMARY OF THE INVENTION

It is therefore an object of the present invention to provide an optical device capable of operating at high speeds and attaining cost reduction. The wording "capable of operating at high speeds" used herein means capable of stably operating at bit rates exceeding 10 Gb/s.

In accordance with the present invention, there is provided an optical device capable of operating at high speeds. This optical device includes an optical fiber, an optical semiconductor element, a base member, a signal terminal, and a pair of ground pins. The optical fiber is optically connected to the optical semiconductor element. The base member is formed of a conductor and has a first surface and a second surface. The optical semiconductor element is mounted on the first surface. The first surface and the second surface are substantially parallel to each other, for example. The signal terminal is electrically connected to the optical semiconductor element. The signal terminal is inserted through a hole extending from the first surface to the second surface of the base member and fixed in the hole filled with a glass paste so that a predetermined characteristic impedance is obtained between the signal terminal and the base member. The pair of ground pins are fixed to the second surface of the base member on the opposite sides of the signal terminal.

With this configuration, a required characteristic impedance can be obtained by the glass paste filling a space between the signal terminal and the inner surface of the hole of the base member, thereby facilitating characteristic impedance matching. Furthermore, since the signal terminal is interposed between the pair of ground pins, grounding can be enhanced to thereby allow high-speed operation of the optical device. In addition, this optical device can be provided by a simple structure, thereby attaining cost reduction.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Some preferred embodiments of the present invention will now be described in detail.

Figure 1A:
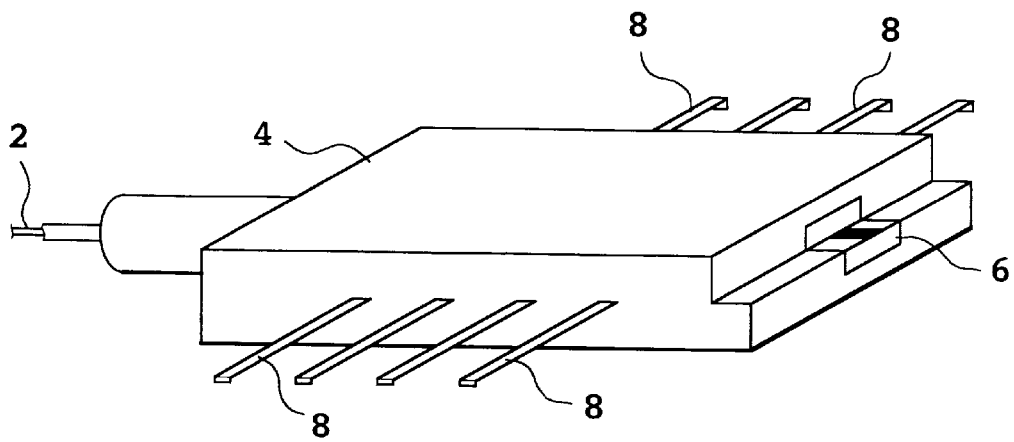
FIGS. 1A and 1B are a perspective view and a sectional view of an optical device (O/E module) in the prior art, respectively.
Figure 1B:
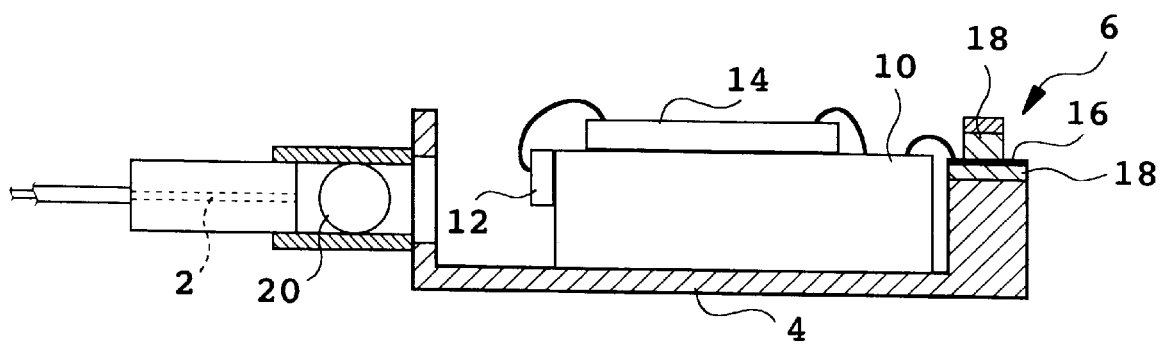
Figure 2:
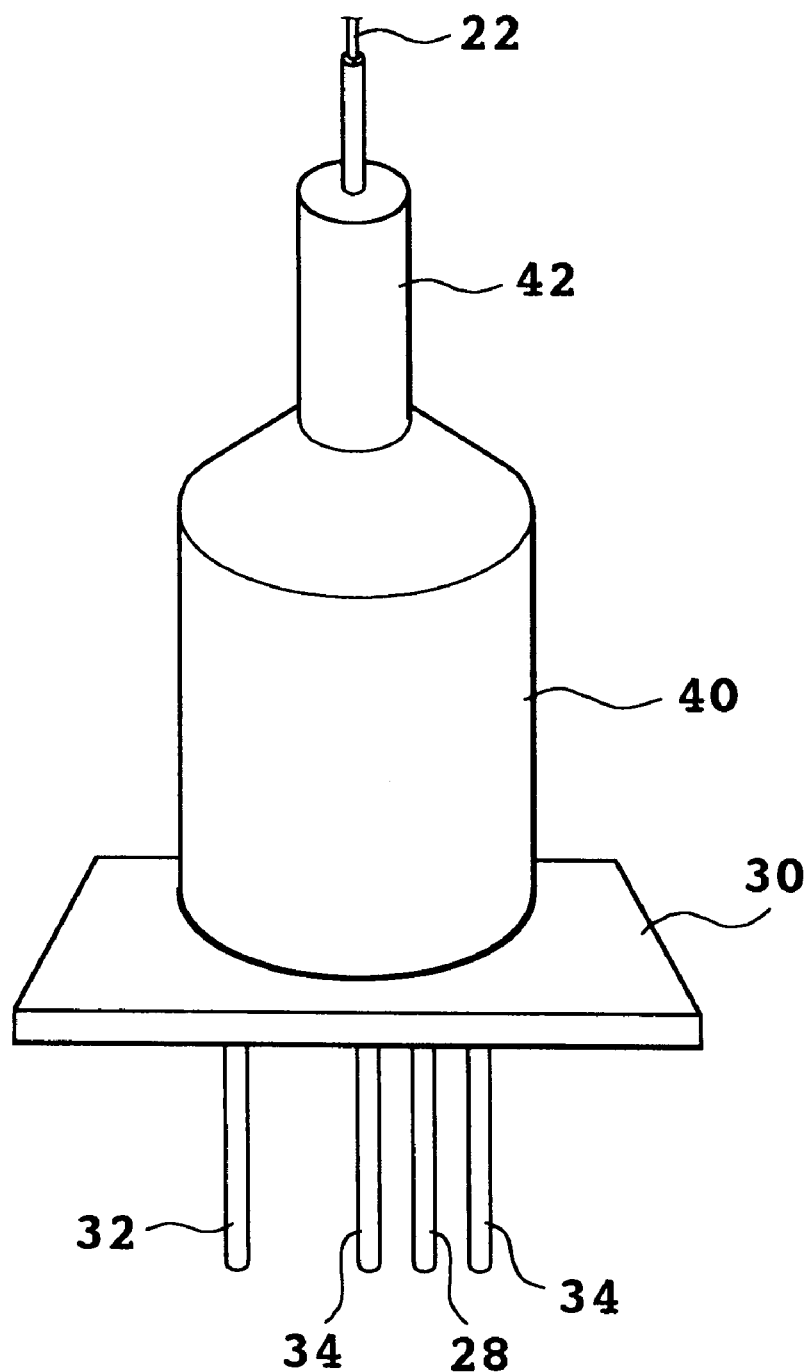
FIG. 2 is a perspective view showing a preferred embodiment of the optical device according to the present invention.
Figure 3:
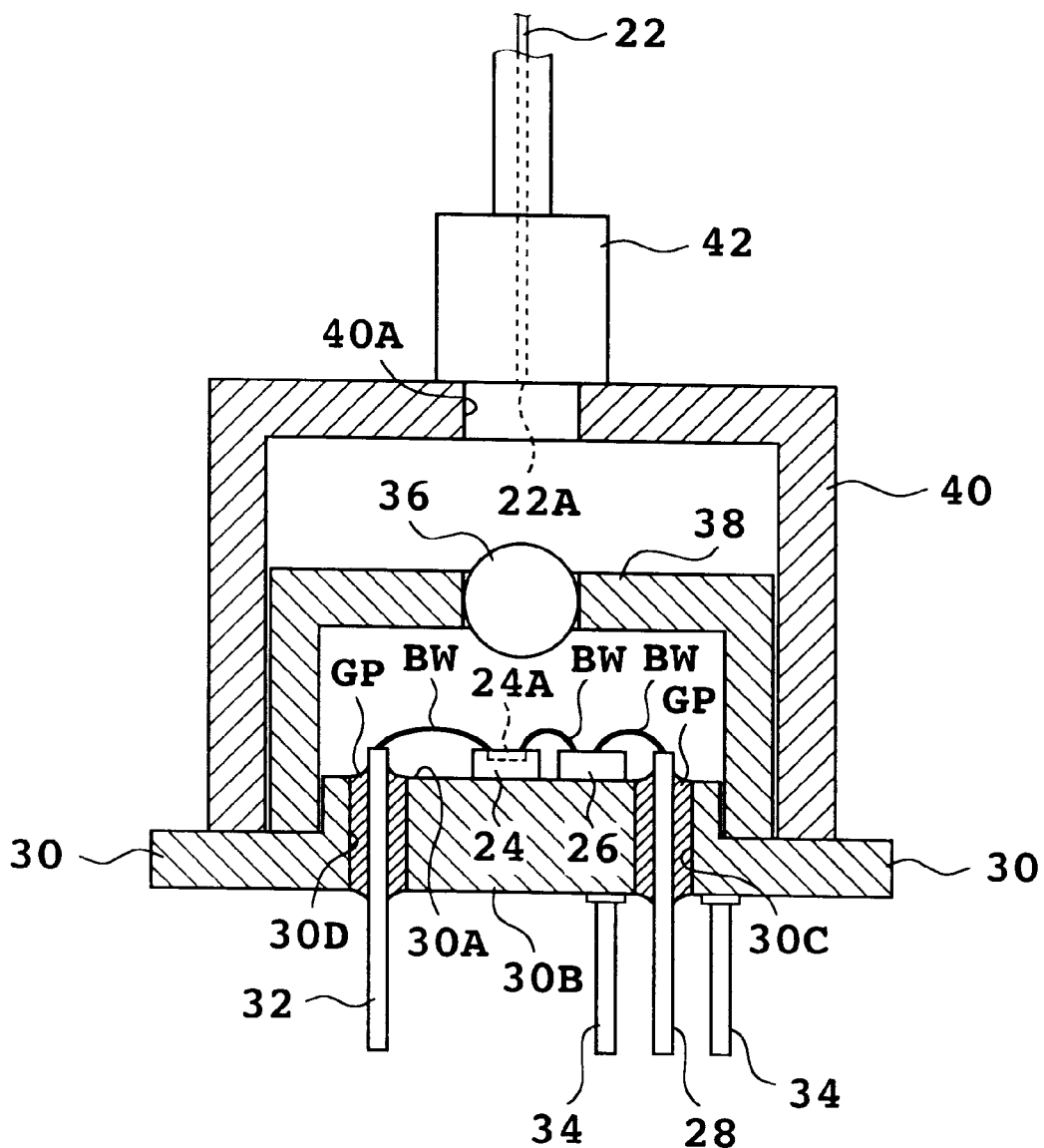
FIG. 3 is a sectional view of the preferred embodiment shown in FIG. 2.

FIGS. 2 and 3 are a perspective view and a sectional view showing a preferred embodiment of the optical device according to the present invention, respectively. This optical device can be used as an O/E module (opto/electric conversion module (optical receiver)) applicable to a system capable of operating at bit rates exceeding 10 Gb/s. This optical device includes a photodetector (e.g., photodiode) 24 for converting an optical signal transmitted by an optical fiber 22 into a high-speed electrical signal, a preamplification IC chip 26 for amplifying the electrical signal, and a signal terminal 28 for outputting the electrical signal amplified by the IC chip 26.

The photodetector 24 and the IC chip 26 are mounted on a first surface 30A of a base member (stem) 30 formed of a conductor. The first surface 30A is defined by an upper surface of a circular thick-walled portion of the base member 30 formed at a substantially central portion thereof. The base member 30 has a second surface 30B defined by a lower surface of the thick-walled portion of the base member 30 and a thin-walled portion of the base member 30 formed around the thick-walled portion.

The base member 30 has through holes 30C and 30D extending from the first surface 30A to the second surface 30B. The signal terminal 28 is inserted through the hole 30C and fixedly held in coaxial relationship with the hole 30C by a glass paste GP filling the hole 30C. Similarly, a bias or low-speed signal terminal 32 is inserted through the hole 30D and fixedly held in coaxial relationship with the hole 30D by a glass paste GP filling the hole 30D.

Electrical connection by bonding wires BW is made between the terminal 32 and a bias voltage input pad of the photodetector 24, between an output pad of the photodetector 24 and an input pad of the IC chip 26, and between an output pad of the IC chip 26 and the signal terminal 28. Further, grounds of the photodetector 24 and the IC chip 26 are connected to the base member 30.

A pair of ground pins 34 are fixed to the second surface 30B of the base member 30 on the opposite sides of the signal terminal 28. Particularly in this preferred embodiment, the ground pins 34 are located on a plane containing a center line of the signal terminal 28 and a center line of the terminal 32, so that the ground pins 34 are substantially parallel to the terminals 28 and 32.

An inner cap 38 having a lens 36 opposed to a light receiving surface 24A of the photodetector 24 is fixed to the base member 30 so as to cover the first surface 30A of the base member 30. An outer cap 40 having a diameter larger than the diameter of the inner cap 38 is fixed to the base member 30 so as to surround the inner cap 38.

The outer cap 40 has an opening 40A opposed to the lens 36 for passing an optical signal output from an end face 22A of the optical fiber 22. The optical fiber 22 is inserted and fixed in a thin hole formed in a ferrule 42. The ferrule 42 is fixed to the outer cap 40 so as to close the opening 40A of the outer cap 40.

The above components are fixed in the following manner, for example. That is, the ground pins 34 are fixed to the base member 30 by resistance welding. The inner cap 38 and the outer cap 40 are fixed to the base member 30 by laser welding. The ferrule 42 is fixed to the outer cap 40 by laser welding. The base member 30, the inner cap 38, and the outer cap 40 are formed of Kovar, for example, and the ferrule 42 is formed of an SUS material, for example.

The relative positional relation among the optical fiber 22, the lens 36, and the photodetector 24 is preliminarily adjusted so that light emerging from the end face 22A of the optical fiber 22 is converged by the lens 36 to enter the light receiving surface 24A of the photodetector 24. Accordingly, an optical signal transmitted by the optical fiber 22 can be received by the photodetector 24.

In the case that the photodetector 24 is provided by a photodiode, a reverse bias voltage is applied through the terminal 22 to the photodetector 24. When an optical signal is input to the light receiving surface 24A of the photodetector 24 in this condition, a photocurrent flowing in the photodetector 24 changes with a change in power (intensity) of the optical signal. The change of the photocurrent is converted into a change in voltage between opposite ends of a load resistor (not shown) built in the IC chip 26. This voltage signal is amplified in the IC chip 26 and next output from the signal terminal 28.

In the case that the optical signal received by the photodetector 24 has a bit rate higher than 10 Gb/s, for example, the electrical signal converted from the optical signal has a frequency in a microwave region. It is necessary to consider a characteristic impedance of a signal transmission line for such a high-speed signal in the microwave region.

Particularly in this preferred embodiment, the photodetector 24 and the IC chip 26 are provided on the same plane (the first surface 30A of the base member 30). Accordingly, the bonding wires BW connecting the photodetector 24, the IC chip 26, and the signal terminal 28 can be reduced in length, so that parasitic capacitance and inductance can be suppressed to thereby easily ensure high-speed characteristics.

Further, the space between the signal terminal 28 and the inner surface of the hole 30C of the base member 30 is filled with the glass paste GP. Accordingly, a predetermined characteristic impedance (e.g., 50Ω) can be easily obtained by suitably designing the shapes of the signal terminal 28 and the base member 30 and selecting the material of the glass paste GP. By setting the characteristic impedance to 50Ω, matching of this optical device to another electronic circuit can be improved.

Further, the pair of ground pins 34 are provided on the opposite sides of the signal terminal 28, and all of the ground pins 34, the base member 30, and the grounds of the photodetector 24 and the IC chip 26 are kept at the same potential. Accordingly, a predetermined characteristic impedance can be easily obtained, and grounding can be enhanced to thereby improve high-speed characteristics.

In addition, the photodetector 24 and the IC chip 26 are provided directly on the base member 30, and no ceramic terminal is needed unlike the prior art. Accordingly, a cost for the optical device can be reduced.

Particularly in this preferred embodiment, the lens 36 is used to obtain a high efficiency of optical coupling between the optical fiber 22 and the photodetector 24. Accordingly, a tolerance to deviation of the end face 22A of the optical fiber 22 can be widened, thereby allowing long-term maintenance of the high optical coupling efficiency, and simplifying a manufacturing process for this optical device including position adjustment of the end face 22A of the optical fiber 22.

Further, the optical fiber 22 is positioned to the base member 30 by the outer cap 40 and the ferrule 42. Accordingly, deviation of the end face 22A of the optical fiber 22 by an external force can be prevented to thereby maintain the high optical coupling efficiency over a long term. In addition, the use of the outer cap 40 and the inner cap 38 can provide a good sealing structure, thereby improving the durability of each sealed member to maintain the high optical coupling efficiency over a long term.

In the case of setting the characteristic impedance of the signal terminal 28 substantially to 50Ω, the ratio between the diameter of the hole 30C of the base member 30 and the diameter of the signal terminal 28 is about 6:1 provided that the permittivity of the glass paste GP is about 5. The tolerance of this ratio for obtaining a good transmission characteristic is in the range of 5.5:1 to 6.5:1, for example.

Figure 4A:
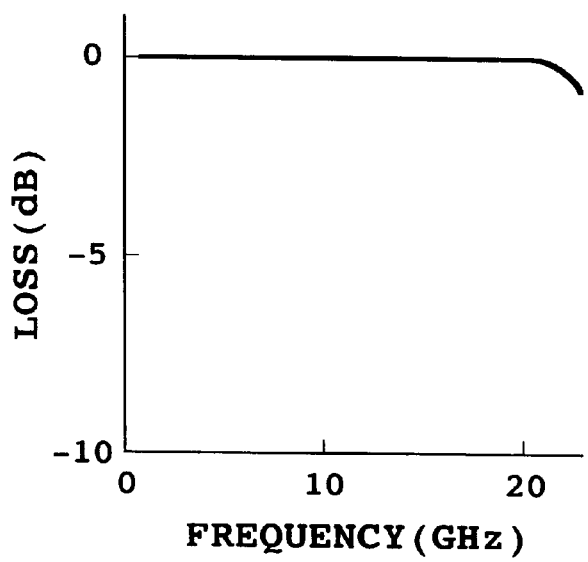
FIGS. 4A and 4B are graphs showing the results of simulation of the characteristics of a signal terminal.
Figure 4B:
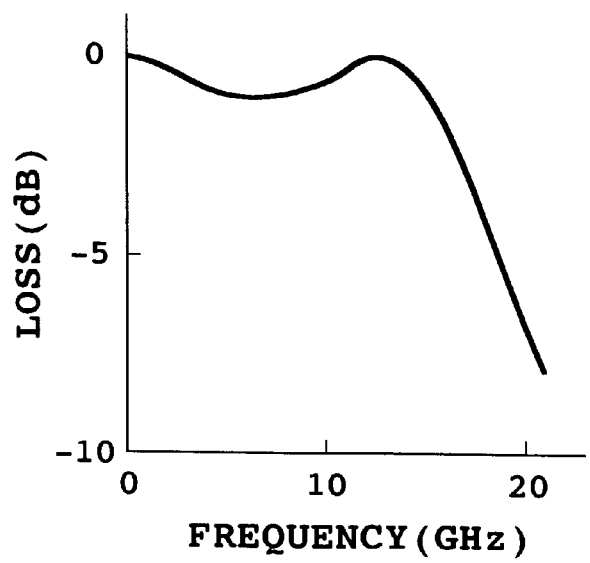

FIGS. 4A and 4B are graphs showing the results of simulation of the characteristics of a signal terminal applicable to the present invention.

More specifically, FIG. 4A shows the result of calculation of a frequency characteristic of loss or S-parameter (S21) in a coaxial structure provided by the signal terminal 28, the base member 30, and the glass paste GP at a portion of the signal terminal 28 extending between the first surface 30A and the second surface 30B of the base member 30 in the case that the diameter of the hole 30C of the base member 30 is 0.6 mm and the diameter of the signal terminal 28 is 0.1 mm. As apparent from FIG. 4A, the loss is substantially 0 dB over a wide range up to a high-frequency region exceeding 20 GHz, thus obtaining a good transmission characteristic. Further, simulation of an S-parameter (S22) was made by using a Smith chart, and as the result it was confirmed that reflected waves were sufficiently small over a wide range up to a high-frequency region exceeding 20 GHz in the same coaxial structure.

Actually, as best shown in FIG. 3, the signal terminal 28 has upper and lower portions respectively projecting from the first surface 30A and the second surface 30B of the base member 30, and the bonding wire BW for connecting the signal terminal 28 and the IC chip 26 is used. Accordingly, it would be necessary to make the simulation in consideration of addition of these inductances.

FIG. 4B shows the result of calculation of a frequency characteristic of loss or S-parameter (S21) in the coaxial structure including the above additional parts in the case that the total length of the above projecting portions of the signal terminal 28 is 0.5 mm and the length of the bonding wire BW is 0.5 mm. In this case, it was confirmed that the loss was sufficiently low over a wide ark range up to about 17 GHz. Further, simulation of an S-parameter (S22) was made by using a Smith chart, and as the result it was confirmed that reflected waves were sufficiently small over a wide range up to about 17 GHz.

In this manner, by setting the characteristic impedance of the coaxial structure provided by the signal terminal 28, the base member 30, and the glass paste GP to a proper value, a good transmission characteristic can be obtained over a wide range up to a high-speed region exceeding 10 GHz or 10 Gb/s.

Figure 5A:
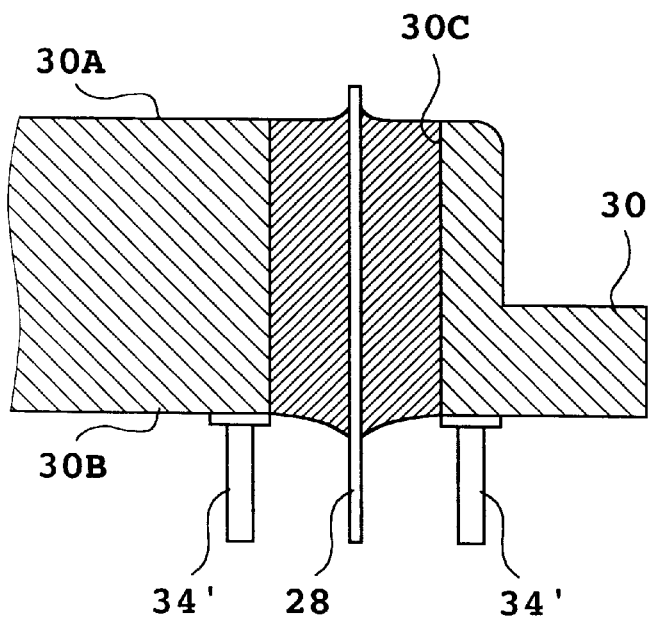
FIG. 5A is a sectional view of a part of the optical device, showing another preferred embodiment including a modification of ground pins.

FIG. 5A is a sectional view of a part of the optical device, showing another preferred embodiment including a modification of the ground pins. A practical range of the diameter of the signal terminal 28 in the case of considering setting of the characteristic impedance falls between 0.1 mm and 0.3 mm. In this preferred embodiment, ground pins 34' each having a diameter larger than the diameter of the signal terminal 28 are used. The diameter of each ground pin 34' is in the range of 0.3 mm to 0.5 mm, for example.

Figure 5B:
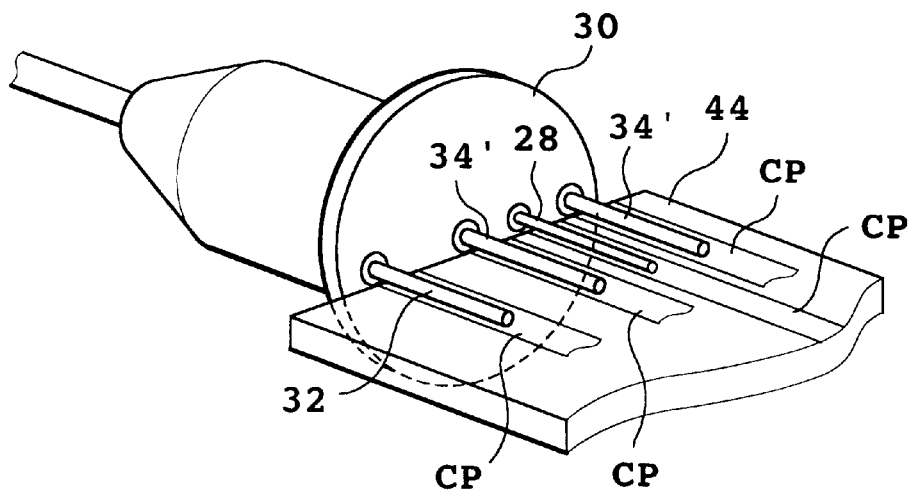
FIG. 5B is a perspective view showing an example of use of the optical device shown in FIG. 5A.

Referring to FIG. 5B, there is shown an example of use of the optical device shown in FIG. 5A. The signal terminal 28, the ground pins 34', and the terminal 32 are arranged on substantially the same plane. Accordingly, these elements are directly soldered to conductor patterns CP formed on a printed wiring board 44, thereby achieving electrical connection and mechanical connection of these elements. The conductor patterns CP extend to an edge of the printed wiring board 44, thereby allowing the optical device to be mounted on the printed wiring board 44 without forming an undue space between the base member 30 and the printed wiring board 44. Accordingly, a sufficiently stable ground potential can be obtained also in a high-frequency region, thereby allowing high-speed operation of the optical device.

Particularly in this preferred embodiment, the diameter of each ground pin 34' is larger than that of the signal terminal 28 whose diameter cannot be much increased because of setting of the characteristic impedance. Accordingly, the mechanical strength of a connected portion of the optical device to the printed wiring board 44 can be improved. Further, the effect of stabilizing the ground potential can be enhanced by a reduction in inductance component of the ground pins 34'.

Figure 6:
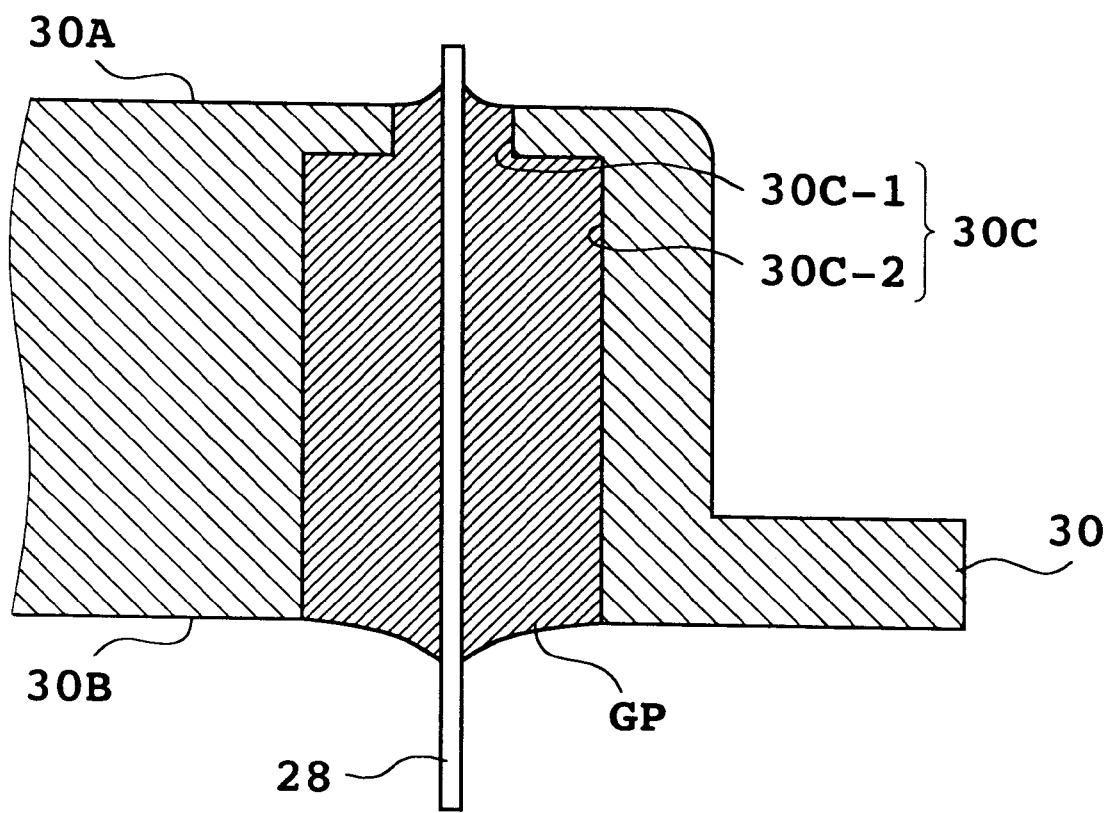
FIG. 6 is a sectional view of a part of the optical device, showing another preferred embodiment including a modification of a base member.

FIG. 6 is a sectional view of a part of the optical device, showing another preferred embodiment including a modification of the base member. In this preferred embodiment, the hole 30C of the base member 30 to be filled with the glass paste GP consists of a first portion 30C-1 having a diameter larger than the diameter of the signal terminal 28 and a second portion 30C-2 having a diameter larger than the diameter of the first portion 30C-1. The first portion 30C-1 is located so as to be exposed to the first surface 30A of the base member 30, and the second portion 30C-2 is located so as to be exposed to the second surface 30B of the base member 30.

As shown in FIG. 6, the vertical length of the first portion 30C-1 is sufficiently smaller than the vertical length of the second portion 30C-2, so that the diameter of the second portion 30C-2 is dominant for the characteristic impedance. In the case that the diameter of the signal terminal 28 is 0.15 mm, for example, the diameter of the second portion 30C-2 for obtaining a required characteristic impedance (e.g., 50Ω) is about 0.9 mm. By setting the diameter of the first portion 30C-1 to 0.6 mm in this case, a mounting portion of the first surface 30A of the base member 30 for mounting the IC chip 26 (see FIG. 3) can be extended by about 0.15 mm toward the signal terminal 28.

Figure 7:
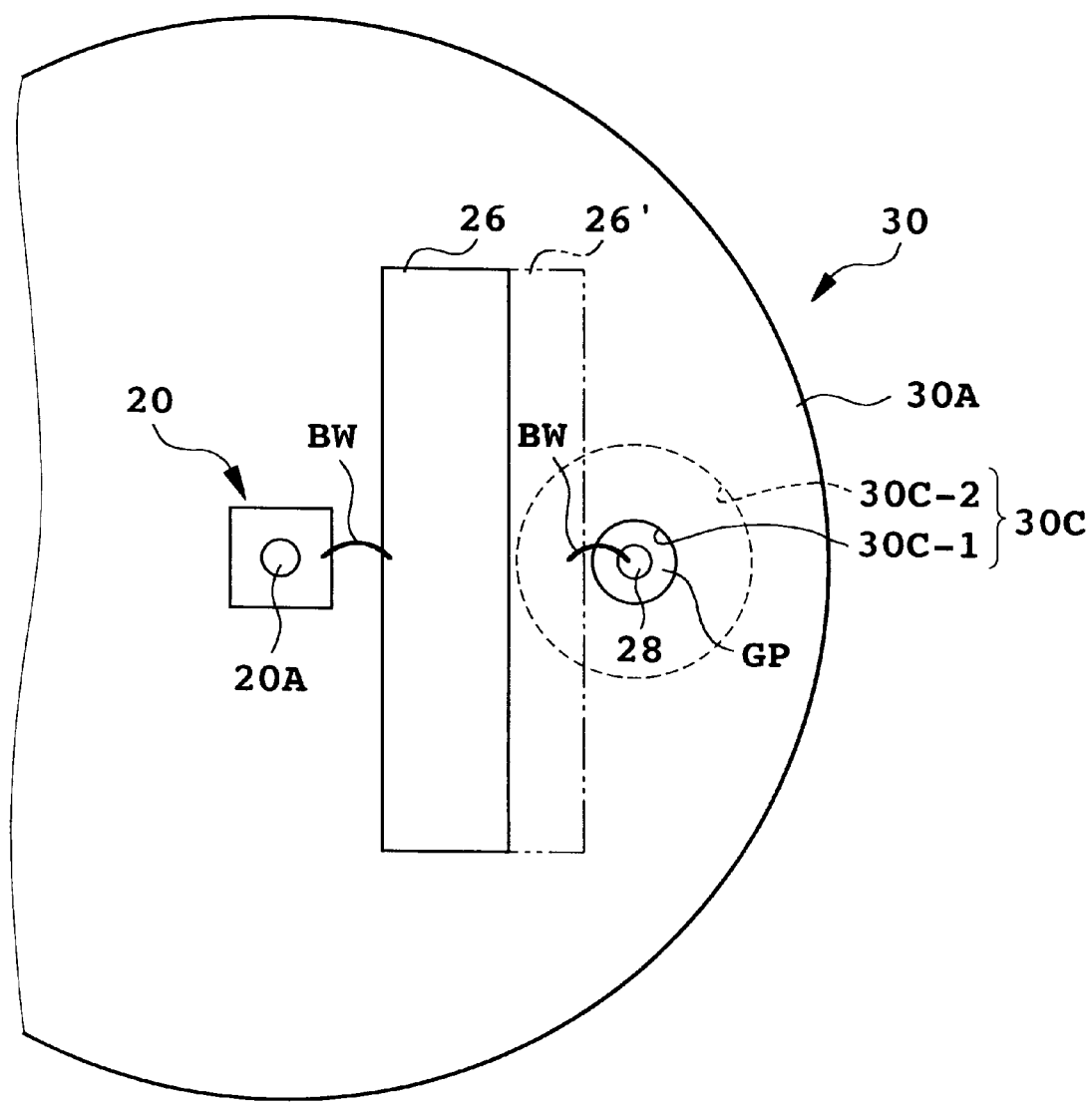
FIG. 7 is a view for illustrating an effect by the preferred embodiment shown in FIG. 6.

This technical effect can be explained with reference to FIG. 7. If the first portion 30C-1 of the hole 30C of the base member 30 is absent, the mounting portion for the IC chip 26 is limited to an area enclosed by the solid line in FIG. 7 as in the preferred embodiment shown in FIG. 3. In contrast therewith, this preferred embodiment has an advantage such that the mounting portion for the IC chip 26 can be extended to a contour line shown by reference numeral 26' owing to the provision of the first portion 30C-1 having a smaller diameter.

As an accompanying effect, the high-speed operability can be further improved by a decrease in length of the bonding wire BW connecting the IC chip 26 and the signal terminal 28.

Figure 8A:
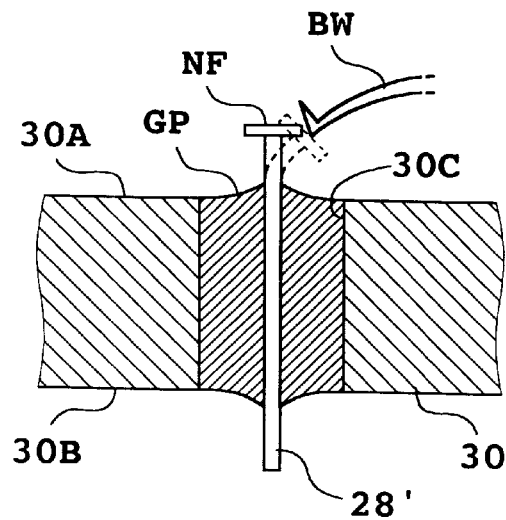
FIGS. 8A and 8B are sectional views of a part of the optical device, showing other preferred embodiments including a modification of a signal terminal.
Figure 8B:
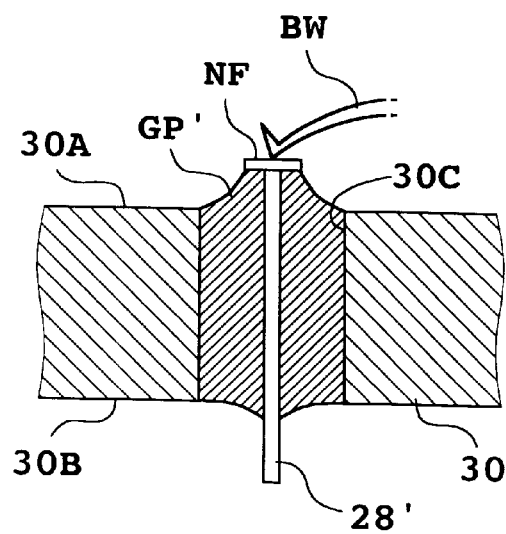

FIGS. 8A and 8B are sectional views of a part of the optical device, showing other preferred embodiments including a modification of the signal terminal.

In the preferred embodiment shown in FIG. 8A, a signal terminal 28' integrally having a nail head NF for facilitating wire bonding. The nail head NF has a thickness ranging from 0.1 mm to 0.2 mm, for example, and a diameter ranging from 0.2 mm to 0.5 mm, for example. The use of the signal terminal 28' can facilitate the bonding of the bonding wire BW for electrically connecting the signal terminal 28' and the IC chip 26 (see FIG. 3) to the nail head NF, thereby facilitating the manufacture of the optical device.

The practical range of the diameter of a signal terminal for obtaining a required characteristic impedance falls between 0.1 mm and 0.3 mm. Accordingly, there is a possibility that the signal terminal may be bent in wire bonding because of an insufficient mechanical strength of the signal terminal. This possibility can be eliminated by the preferred embodiment shown in FIG. 8B. That is, a glass paste GP' to be changed in the hole 30C is raised to the bottom surface of the nail head NF. With this configuration, deformation of the signal terminal 28' in wire bonding can be prevented, thereby further facilitating the manufacture of the optical device.

Figure 9:
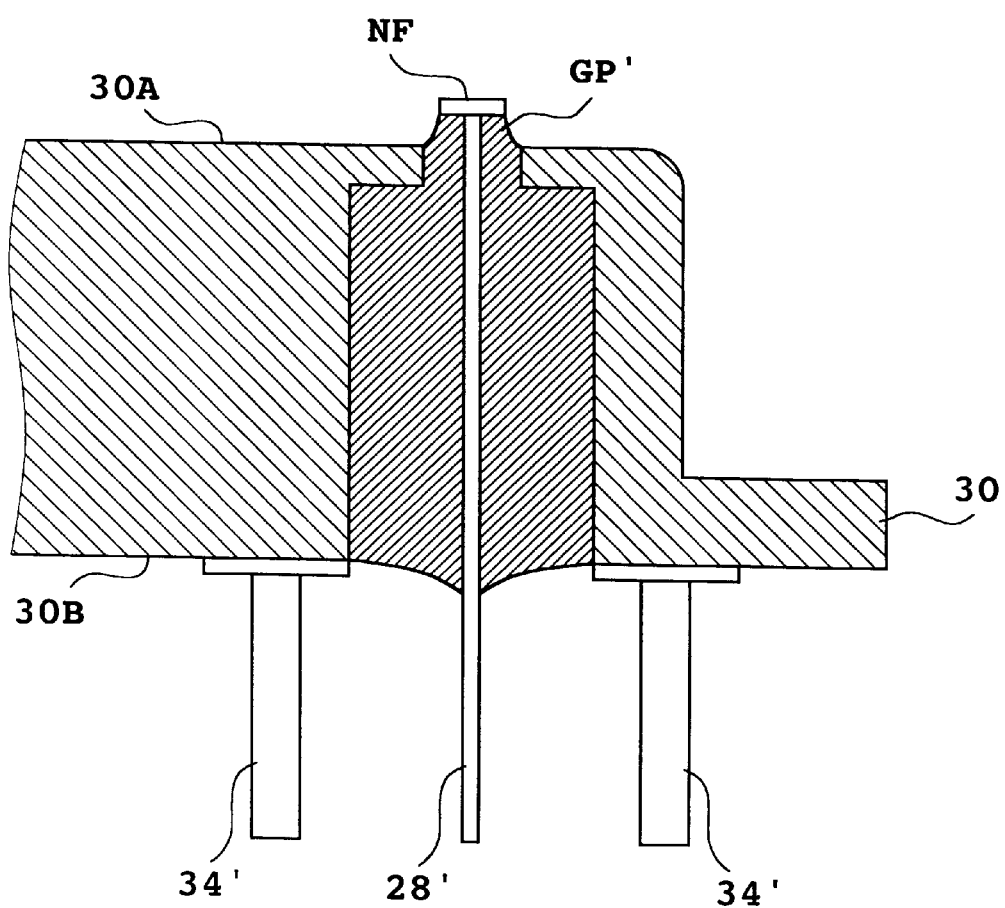
FIG. 9 is a sectional view showing an essential part of another preferred embodiment of the optical device according to the present invention.

FIG. 9 is a sectional view showing an essential part of another preferred embodiment of the optical device according to the present invention. In contrast with the preferred embodiment shown in FIG. 3, this preferred embodiment is characterized in that the combination of the modification shown in FIG. 5A, the modification shown in FIG. 6, and the modification shown in FIG. 8B is adopted. According to this preferred embodiment, it is possible to provide an optical device greatly improved in high-speed operability due to characteristic impedance matching and grounding enhancement and also improved in manufacturability, and suitable for cost reduction.

While a photodetector for receiving an optical signal is used as the optical semiconductor element in each of the above preferred embodiments, the present invention is not limited to this configuration. Also in the case that the optical semiconductor element is a light emitting element such as LD (laser diode) and LED (light emitting diode), the present invention is applicable. For example, by applying the present invention to an optical transmitter including an LD and its drive circuit, high-speed operability of the optical transmitter can be ensured and cost reduction can also be attained.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device comprising:

an optical fiber;

an optical semiconductor element optically connected to said optical fiber;

a base member formed of a conductor, said base member having a first surface and a second surface, said optical semiconductor element being mounted on said first surface;

a signal terminal electrically connected to said optical semiconductor element and inserted through a hole extending from said first surface to said second surface of said base member, said signal terminal being fixed in said hole filled with a glass paste so that a predetermined characteristic impedance is obtained between said signal terminal and said base member; and a pair of ground pins fixed to said second surface of said base member on the opposite sides of said signal terminal.

2. An optical device according to claim 1, wherein said predetermined characteristic impedance is substantially 50Ω.

3. An optical device according to claim 1, wherein:

said optical semiconductor element comprises a photodetector for converting an optical signal output from said optical fiber into an electrical signal;

said optical device further comprising an amplifier operatively connected between said photodetector and said signal terminal for amplifying said electrical signal.

4. An optical device according to claim 1, further comprising a cap member for holding said optical fiber to said base member in predetermined positional relationship with each other.

5. An optical device according to claim 1, further comprising a lens for increasing an efficiency of optical coupling between said optical fiber and said optical semiconductor element.

6. An optical device according to claim 1, wherein each of said pair of ground pins has a diameter larger than the diameter of said signal terminal.

7. An optical device according to claim 1, wherein said signal terminal and said pair of ground pins are arranged on substantially the same plane.

8. An optical device according to claim 7, further comprising a printed wiring board electrically and mechanically connected to said signal terminal and said pair of ground pins.

9. An optical device according to claim 1, wherein:

said optical semiconductor element comprises a photodiode;

said optical device further comprising a terminal for applying a reverse bias voltage to said photodiode.

10. An optical device according to claim 1, wherein said hole of said base member comprises a first portion located so as to be exposed to said first surface and having a first diameter larger than the diameter of said signal terminal, and a second portion located so as to be exposed to said second surface and having a second diameter larger than said first diameter.

11. An optical device according to claim 1, wherein said signal terminal integrally has a nail head having a flat surface subjected to wire bonding.

12. An optical device according to claim 11, wherein said glass paste is in contact with another surface of said nail head opposite to said flat surface.

* * * * *

UNITED STATES PATENT AND TRADEMARK OFFICE
CERTIFICATE OF CORRECTION

PATENT NO.:     6,074,102
DATED      :    June 13, 2000
INVENTOR(S):    Yoichi OIKAWA It is certified that an error appears in the above-identified patent and that said Letters Patent is hereby corrected as shown below:

```
On the title page, item
   [56]   References Cited
```

Change "4,989,930   2/1991   Nakagawa et al." to
          --4,989,930   6/1998   Nakagawa et al.--

Signed and Sealed this

Third Day of April, 2001

Attest:

NICHOLAS P. GODICI

*Attesting Officer*      Acting Director of the United States Patent and Trademark Office